(12) United States Patent
Seo et al.

(10) Patent No.: US 9,276,044 B2
(45) Date of Patent: Mar. 1, 2016

(54) DISPLAY DEVICE AND METHOD FOR MANUFACTURING DISPLAY DEVICE

(71) Applicant: Samsung Display Co., Ltd., Yongin, Gyeonggi-Do (KR)

(72) Inventors: Jong-Oh Seo, Yongin (KR); Hyun-Gue Kim, Yongin (KR)

(73) Assignee: Samsung Display Co., Ltd., Samsung-ro, Giheung-Gu, Yongin-si, Gyeonggi-Do (KR)

( * ) Notice: Subject to any disclaimer, the term of this patent is extended or adjusted under 35 U.S.C. 154(b) by 197 days.

(21) Appl. No.: 13/846,594

(22) Filed: Mar. 18, 2013

(65) Prior Publication Data

US 2014/0077178 A1 Mar. 20, 2014

(30) Foreign Application Priority Data

Sep. 19, 2012 (KR) ........................ 10-2012-0103950

(51) Int. Cl.
| | | |
|---|---|---|
| *H01L 27/32* | (2006.01) | |
| *H01L 51/56* | (2006.01) | |
| *H01L 29/786* | (2006.01) | |
| *H01L 27/12* | (2006.01) | |

(52) U.S. Cl.
CPC ............ *H01L 27/32* (2013.01); *H01L 27/3258* (2013.01); *H01L 51/56* (2013.01); *H01L 27/124* (2013.01); *H01L 27/1259* (2013.01); *H01L 27/322* (2013.01); *H01L 27/3274* (2013.01); *H01L 29/7869* (2013.01)

(58) Field of Classification Search
CPC ..... H01L 51/56; H01L 27/32; H01L 27/3258; H01L 27/332; H01L 27/3276; H01L 27/3265; H01L 27/124; H01L 27/1259; H01L 27/3274; H01L 29/7869; H01L 27/1225; H01L 27/3262
USPC .................... 257/40, 72, 66, 88, 59, E51.005, 257/E29.117; 438/29, 82, 99
See application file for complete search history.

(56) References Cited

U.S. PATENT DOCUMENTS

2006/0267491 A1* 11/2006 Koo et al. ..................... 313/511

FOREIGN PATENT DOCUMENTS

| | | |
|---|---|---|
| KR | 10-0672647 | 1/2007 |
| KR | 10-0775883 | 11/2007 |
| KR | 10-2012-0007305 | 1/2012 |

* cited by examiner

*Primary Examiner* — Thinh T Nguyen
(74) *Attorney, Agent, or Firm* — Robert E. Bushnell, Esq.

(57) ABSTRACT

A display device includes a substrate; a color filter layer positioned on the substrate correspondingly to a path where an image is outputted; and an organic overcoat layer covering the color filter layer and including an ion implantation layer coated on the surface.

20 Claims, 9 Drawing Sheets

1000

DISPLAY DEVICE AND METHOD FOR MANUFACTURING DISPLAY DEVICE

CLAIM OF PRIORITY

This application makes reference to, incorporates the same herein, and claims all benefits accruing under 35 U.S.C. §119 from an application earlier filed in the Korean Intellectual Property Office on 19 Sep. 2012 and there duly assigned Serial No. 10-2012-0103950.

BACKGROUND OF THE INVENTION

1. Field of the Invention

An embodiment of the present invention relates generally to a display device and a method for manufacturing the display device, and more particularly, to a display device including a color filter layer and a method for manufacturing the display device.

2. Description of the Related Art

A display device is a device displaying images, and recently, an organic light emitting diode display device has received attention.

Since the organic light emitting diode display device has a self-emission characteristic and does not require a separate light source, a thickness and a weight of the organic light emitting diode display device may be reduced in comparison with a liquid crystal display device. Further, the organic light emitting diode display device has high-definition characteristics such as lower power consumption, higher luminance, and a higher response speed.

Recently, an organic light emitting diode display device, which includes an organic emission layer emitting white light, a color filter layer positioned correspondingly to the organic emission layer, and an overcoat layer covering the color filter layer for planarizing protrusions and depressions by the color filter layer, has been developed.

However, in a contemporary organic light emitting diode display device including a color filter layer and an overcoat layer, there was a problem in that a defect occurred in the organic emission layer due to an outgasing phenomenon generated from the color filter layer and the overcoat layer made of an organic material during a manufacturing process.

Further, in the contemporary organic light emitting diode display device including the color filter layer and the overcoat layer, since the color filter layer and the overcoat layer are made of the organic material, there was a problem in that the defect occurred in the organic emission layer because external moisture is permeated into the organic emission layer through the color filter layer and the overcoat layer.

The above information disclosed in this Background section is only for enhancement of understanding of the background of the described technology and therefore it may contain information that does not form the prior art that is already known in this country to a person of ordinary skill in the art.

SUMMARY OF THE INVENTION

An aspect of the present invention makes in an effort to provide a display device and a method for manufacturing the display device having advantages of minimizing an outgasing phenomenon generated from a color filter layer and an overcoat layer and simultaneously, minimizing external moisture from permeating an organic emission layer through the color filter layer and the overcoat layer, when the color filter layer and the overcoat layer are included in the display device.

An embodiment of the present invention provides a display device displaying an image, including: a substrate; a color filter layer positioned on the substrate geometrically corresponding to a path along which the image is outputted; and an organic overcoat layer covering the color filter layer and including an ion implantation layer coated on the surface of the organic overcoat layer.

The organic overcoat layer may further include an organic overcoat layer main body which is positioned between the ion implantation layer and the color filter layer, and the ion implantation layer may be more hardened than the organic overcoat layer main body.

The organic overcoat layer may contain an organic material, and the ion implantation layer may be formed by doping boron B in the organic material by an ion implanting method.

The display device may further include an organic light emitting diode positioned on the organic overcoat layer and emitting white light.

The organic light emitting diode may include a first electrode positioned on the organic overcoat layer; an organic emission layer positioned on the first electrode and emitting white light; and a second electrode positioned on the organic emission layer.

The first electrode may have a light transmitting property, and the second electrode may have a light reflective property.

The display device may further include a thin film transistor connected with the first electrode.

The display device may further include a first inorganic insulation layer positioned between the substrate and the color filter layer.

The display device may further include a second inorganic insulation layer positioned between the organic overcoat layer and the organic light emitting diode.

Another embodiment of the present invention provides a method for manufacturing a display device displaying an image, including steps of: forming a color filter layer on a substrate geometrically corresponding to a path where the image is outputted; forming an organic overcoat layer covering the color filter layer; and coating an ion implantation layer on the surface of the organic overcoat layer.

The organic overcoat layer may contain an organic material, and the coating of the ion implantation layer on the surface of the organic overcoat layer may be performed by doping boron B in the organic material of the organic overcoat layer by using an ion implanting method.

The method for manufacturing a display device may further include forming an organic light emitting diode emitting white light on the organic overcoat layer.

In accordance with embodiments of the present invention, it is possible to provide a display device and a method for manufacturing the display device having advantages of minimizing an outgasing phenomenon generated from a color filter layer and an overcoat layer and simultaneously, minimizing external moisture from permeating an organic emission layer through the color filter layer and the overcoat layer, when the color filter layer and the overcoat layer are included in the display device.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1:
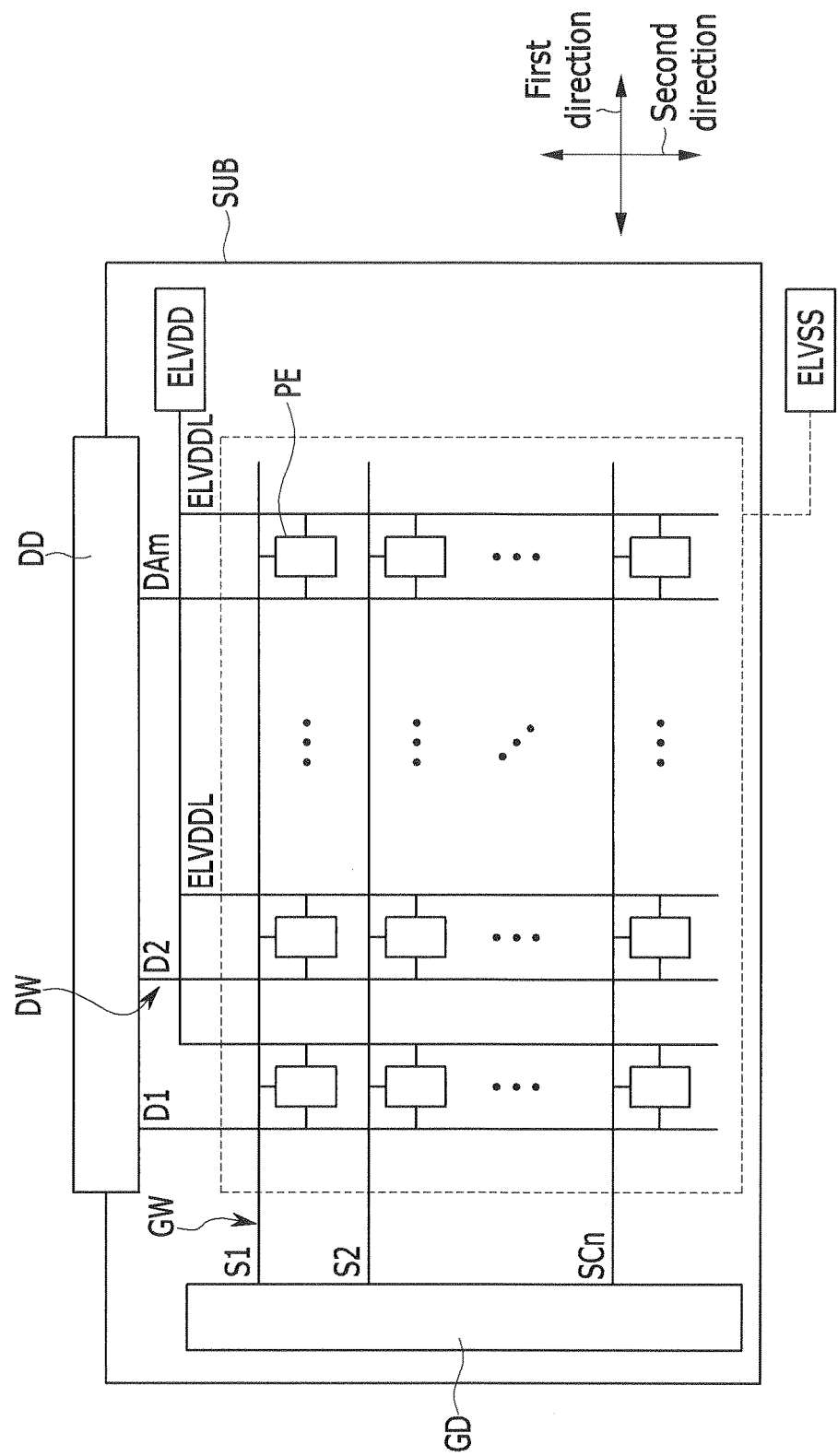
FIG. 1 is a diagram illustrating a display device constructed with the principle of a first embodiment of the present invention.

The present invention will be described more fully hereinafter with reference to the accompanying drawings, in which exemplary embodiments of the invention are shown. As those skilled in the art would realize, the described embodiments may be modified in various different ways, all without departing from the spirit or scope of the present invention.

The drawings and description are to be regarded as illustrative in nature and not restrictive. Like reference numerals designate like elements throughout the specification.

Further, the size and thickness of each configuration shown in the drawings are arbitrarily shown for understanding and ease of description, but the present invention is not limited thereto.

In the drawings, the thickness of layers, films, panels, regions, etc., are exaggerated for clarity. Further, in the drawings, for understanding and ease of description, the thickness of some layers and areas is exaggerated. It will be understood that when an element such as a layer, film, region, or substrate is referred to as being "on" another element, it can be directly on the other element or intervening elements may also be present.

Further, unless explicitly described to the contrary, the word "comprise" and variations such as "comprises" or "comprising", will be understood to imply the inclusion of stated elements but not the exclusion of any other elements. In addition, throughout the specification, the word "on" will be understood to be positioned above or below a target element and will be necessarily not understood to be positioned at an upper side based on a gravity direction.

Hereinafter, a display device constructed with the principle of a first embodiment of the present invention will be described with reference to FIGS. 1 through 4.

FIG. 1 is a diagram illustrating a display device constructed with the principle of a first embodiment of the present invention.

As illustrated in FIG. 1, a display device 1000 constructed with the principle of the first embodiment of the present invention includes a substrate SUB, a gate driver GD, gate wires GW, a data driver DD, data wires DW, and pixels PE. Here, the pixel PE means a minimum unit displaying an image, and the display device 1000 displays the image through a plurality of pixels PE.

The substrate SUB is formed by a transparent insulating substrate made of glass, quartz, ceramic, plastic, and the like. However, the first embodiment of the present invention is not limited thereto, and the substrate SUB may be formed by a metallic substrate made of stainless steel and the like. Further, in the case where the substrate SUB is made of plastic and the like, the display device 1000 may have a flexible characteristic and a stretchable or rollable characteristic.

The gate driver GD sequentially supplies scan signals to the gate wires GW in response to a control signal supplied from an external control circuit (not illustrated), for example, a timing controller. Then, the pixels PE are selected by the scan signal to sequentially receive data signals.

The gate wires GW are positioned on the substrate SUB and extend in a first direction. The gate wires GW include scan lines S1-SCn, and the scan line SCn is connected with the gate driver GD to receive the scan signal from the gate driver GD.

Meanwhile, in the display device 1000 constructed with the principle of the first embodiment of the present invention, the gate wires GW include the scan line SCn; however, in a display device according to another embodiment, the gate wires may further include an additional scan line, an initial power supply line, a light emission control line and the like. In this case, the display device may be an active matrix (AM) organic light emitting diode display device having a 6Tr-2Cap structure.

The data driver DD supplies a data signal to a data line DAm among the data wires DW in response to a control signal supplied from the outside of the timing controller and the like. The data signal supplied to the data line DAm is supplied to the pixel PE selected by the scan signal whenever the scan signal is supplied to the scan line SCn. Then, the pixel PE charges a voltage corresponding to the data signal to emit light at luminance corresponding thereto.

The data wires DW may be positioned on the gate wires GW, or positioned between the gate wires GW and the substrate SUB, and extends in a second direction crossing the first direction. The data wires DW include data lines D1-Dm and a driving power supply line ELVDDL. The data line DAm is connected with the data driver DD and receives a data signal from the data driver DD. The driving power supply line ELVDDL is connected with an external first power supply ELVDD and receives a driving power supply from the first power supply ELVDD.

The pixel PE is positioned in a region where the gate wires GW and the data wires DW cross each other to be connected with the gate wires GW and the data wires DW. The pixel PE includes a first power supply ELVDD, two thin film transistors and capacitors connected with the gate wires GW and the data wires DW, and an organic light emitting diode connected with a second power supply ELVSS with a thin film transistor therebetween. The pixel PE is selected when the scan signal is supplied through the scan line SCn to charge a voltage corresponding to the data signal through the data line DAm and emits light having predetermined luminance in response to the charged voltage. A detailed layout of the pixel PE will be described below.

Hereinafter, a configuration of the pixel PE will be described in detail with reference to FIGS. 2 and 3.

Figure 2A:
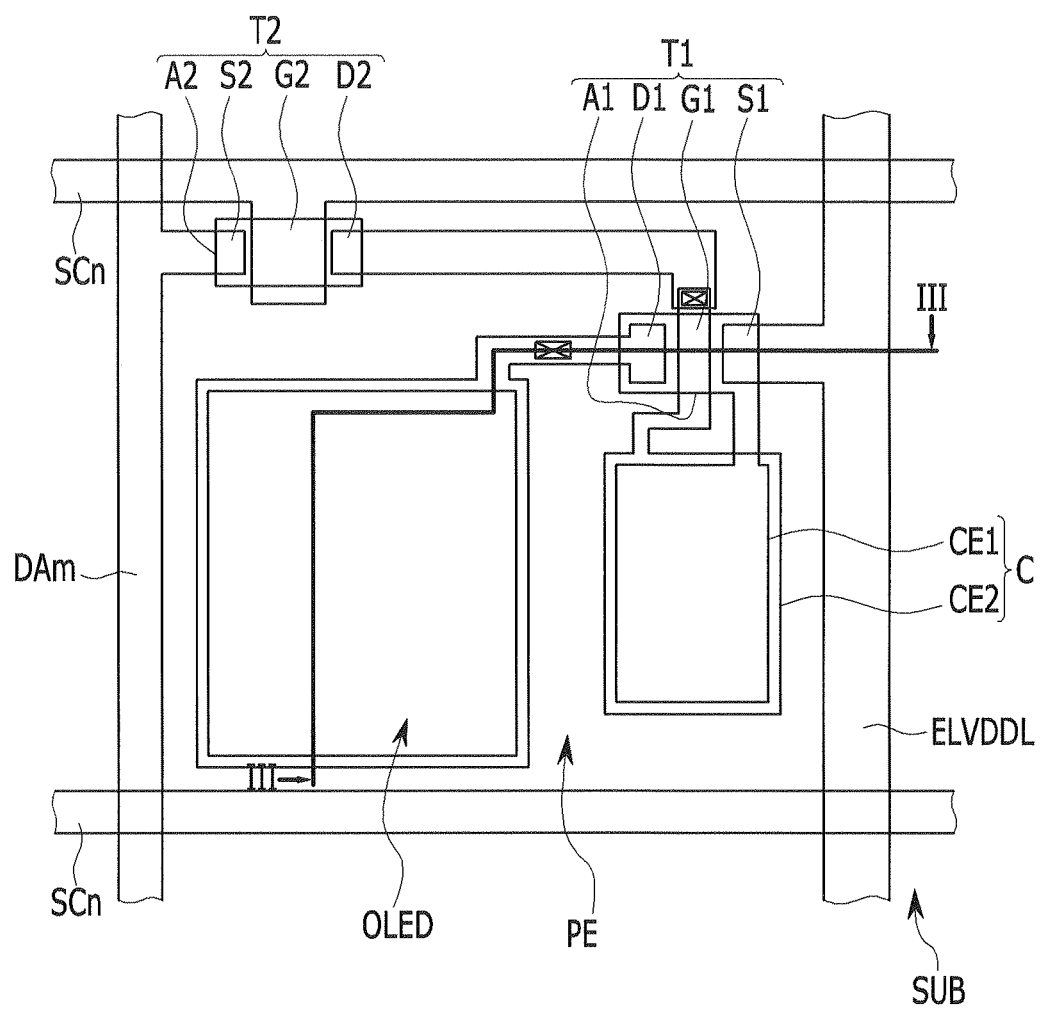
FIG. 2A is a layout view illustrating a pixel part illustrated in FIG. 1.
Figure 2B:
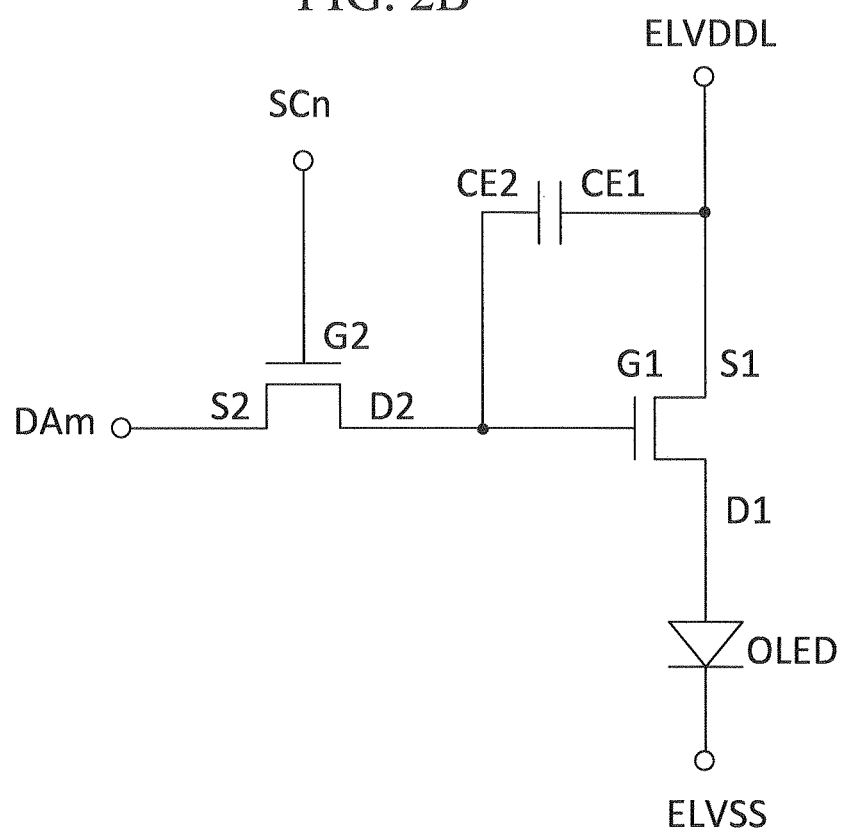
FIG. 2B is a circuit diagram illustrating a pixel part illustrated in FIG. 1.

FIG. 2A is a layout view illustrating a pixel part illustrated in FIG. 1, and FIG. 2B is a circuit diagram illustrating a pixel part illustrated in FIG. 1.

First, as illustrated in FIGS. 2A and 2B, one pixel PE has a 2Tr-1Cap structure in which an organic light emitting diode OLED, two thin film transistors TFTs T1 and T2, and one capacitor C are disposed. However, in another embodiment, one pixel may have a structure in which three or more thin film transistors and two or more capacitors are disposed.

The organic light emitting diode OLED includes a first electrode which is an anode electrode functioning as a hole implantation electrode, a second electrode which is a cathode electrode functioning as an electron implantation electrode, and an organic emission layer disposed between the first electrode and the second electrode.

In detail, in the first embodiment, the display device includes a switching thin film transistor T2 formed for each pixel PE, a driving thin film transistor T1, and a capacitor C. The present invention is however not limited to the above described structure and may be variously modified in a range capable of being easily modified and implemented by a person of ordinary skill in the art.

The switching thin film transistor T2 includes a switching gate electrode G2, a switching active layer A2, a switching source electrode S2, and a switching drain electrode D2.

The switching gate electrode G2 is connected with the scan line SCn. The switching active layer A2 is positioned to correspond to the switching gate electrode G2, and the switching source electrode S2 and the switching drain electrode D2 are connected to each end, respectively. The switching source electrode S2 is connected with the data line DAm. The switching drain electrode D2 is spaced apart from the switching source electrode S2 with the switching gate electrode G2 therebetween and is connected with a second capacitor electrode CE2 of the capacitor C with a driving gate electrode G1 of the driving thin film transistor T1 disposed therebetween.

The driving thin film transistor T1 includes a driving gate electrode G1, a driving active layer A1, a driving source electrode S1, and a driving drain electrode D1.

The driving gate electrode G1 is connected with the switching drain electrode D2 of the switching thin film transistor T2 and the second capacitor electrode CE2 of the capacitor C. The driving active layer A1 is connected with the first capacitor electrode CE1 of the capacitor C. The driving source electrode S1 and the driving drain electrode D1 are spaced apart from each other with the driving gate electrode G1 therebetween to be connected to both ends of the driving active layer A1, respectively. The driving source electrode S1 is connected with the driving power supply line ELVDDL, and the driving drain electrode D1 is connected with the first electrode which is the anode electrode of the organic light emitting diode OLED.

That is, the switching source electrode S2 of the switching thin film transistor T2 is connected to the data line DAm, and the switching gate electrode G2 of the switching thin film transistor T2 is connected to the scan line SCn. In addition, a node is formed between the switching drain electrode D2 of the switching thin film transistor T2 and the capacitor C, and the switching drain electrode D2 of the switching thin film transistor T2 is connected with the second capacitor electrode CE2 of the capacitor C. Further, the switching drain electrode D2 of the switching thin film transistor T2 is connected with the driving gate electrode G1 of the driving thin film transistor T1. In addition, the driving power supply line ELVDDL is connected to the driving source electrode S1 of the driving thin film transistor T1, and the first electrode which is an anode electrode of the organic light emitting diode OLED is connected to the driving drain electrode D1.

The capacitor C includes a first capacitor electrode CE1 and a second capacitor electrode CE2 facing each other with an insulating layer therebetween. The first capacitor electrode CE1 is connected with the driving power supply line ELVDDL, and the second capacitor electrode CE2 is connected with the switching drain electrode D2 of the switching thin film transistor T2 through the driving gate electrode G1.

The aforementioned switching thin film transistor T2 is used as a switching element selecting a pixel PE to emit light. When the switching thin film transistor T2 is turned on, a power supply is supplied from the driving power supply line ELVDDL to the first capacitor electrode CE1 and simultaneously, the power supply is supplied from the data line DAm to the second capacitor electrode CE2 through the switching thin film transistor T2, and as a result, the capacitor C is charged. In this case, a quantity of the charged electric charge is proportional to a voltage applied from the data line DAm. In addition, in a state where the switching thin film transistor T2 is turned off, a gate potential of the driving thin film transistor T1 increases according to a potential charged in the capacitor C. In addition, the driving thin film transistor T1 is turned on when the gate potential exceeds a threshold voltage. Then, the voltage applied to the driving power supply line ELVDDL is applied to the organic light emitting diode OLED through the driving thin film transistor T1, and as a result, the organic light emitting diode OLED emits light.

As such, the layout of the pixel PE is not limited to those described above and may be variously modified in a range capable of being easily modified and implemented by a person of ordinary skill in the art.

Next, a laminating order of the pixels PE of the display device 1000 according to the first embodiment of the present invention will be described with reference to FIGS. 3 and 4.

Figure 3:
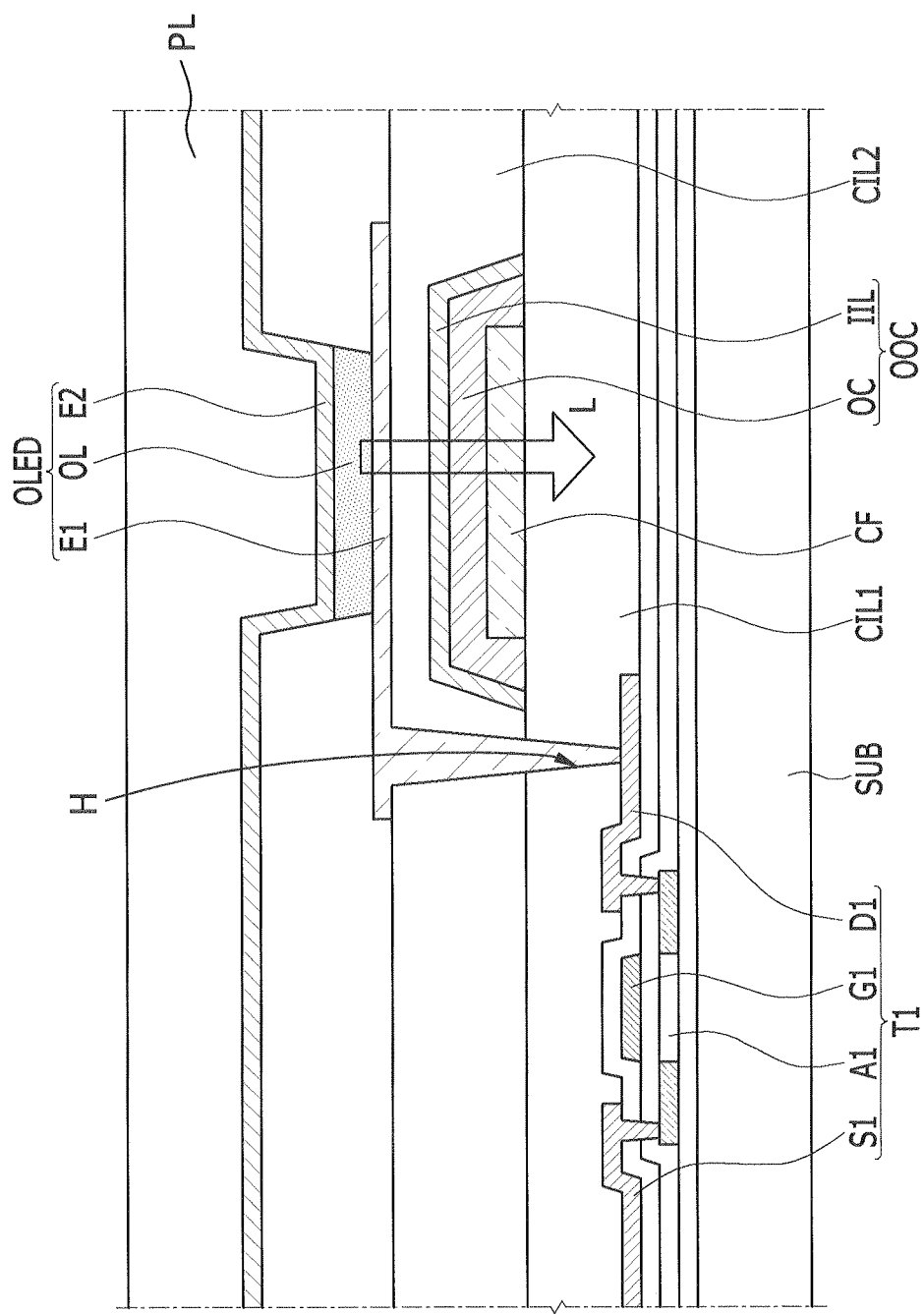
FIG. 3 is a cross-sectional view of FIG. 2A taken along line III-III.

FIG. 3 is a cross-sectional view of FIG. 2A taken along line III-III.

As illustrated in FIG. 3, the pixel PE includes a substrate SUB, a driving thin film transistor T1, a first inorganic insulation layer CIL1, a color filter layer CF, an organic overcoat layer OOC, a second inorganic insulation layer CIL2, an organic light emitting diode OLED, and a protection layer PL which are laminated in sequence.

The driving thin film transistor T1 is positioned on the substrate SUB. The driving drain electrode D1 of the driving thin film transistor T1 is connected with a first electrode E1 of the organic light emitting diode OLED through a contact hole H. Meanwhile, the above switching thin film transistor T2 and the capacitor C may be positioned on the same layer as the driving thin film transistor T1.

The first inorganic insulation layer CIL1 is positioned between the substrate SUB and the color filter layer CF and contains an inorganic material such as silicon nitride (SiNx) or silicon oxide (SiOx). The first inorganic insulation layer CIL1 may be formed in a single layer or a multilayer. The first inorganic insulation layer CIL1 containing the inorganic material is positioned between the substrate SUB and the color filter layer CF, and as a result, moisture is suppressed from being permeated into the organic light emitting diode OLED from the outside and simultaneously, outgasing generated from the color filter layer CF and the organic overcoat layer 0° C. to be described below is suppressed.

The color filter layer CF is positioned between the organic overcoat layer 0° C. and the first inorganic insulation layer CIL1 geometrically corresponding to the organic light emitting diode OLED. The color filter layer CF is positioned on the substrate SUB geometrically corresponding to a path L along which the light emitted from the organic light emitting diode OLED is outputted. That is, the color filter layer CF is positioned on the substrate SUB geometrically corresponding to a path L along which an image is outputted. The color filter layer CF serves to convert a wavelength of white light emitted from the organic light emitting diode OLED. The color filter layer CF may have colors of red, green, blue, and the like and contains an organic material.

Figure 4:
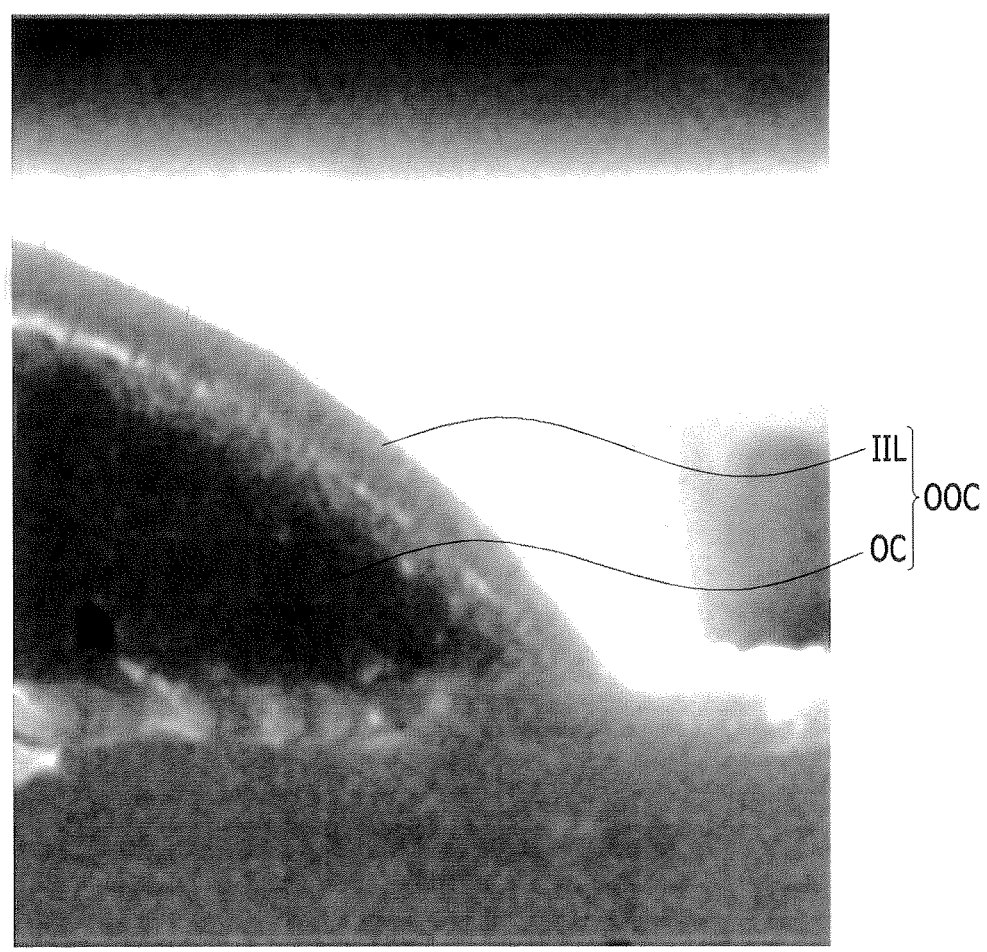
FIG. 4 is a photograph illustrating a cross section of an organic overcoat layer illustrated in FIG. 3.

FIG. 4 is a photograph illustrating a cross section of an organic overcoat layer illustrated in FIG. 3.

As illustrated in FIGS. 3 and 4, the organic overcoat layer 0° C. covers the color filter layer CF in order to planarize protrusions and depressions formed by the color filter layer CF. In one embodiment, the organic overcoat layer 0° C. covers the entirety of the color filter layer CF. The organic overcoat layer 0° C. includes an organic overcoat layer main body OC and an ion implantation layer IIL.

The organic overcoat layer main body OC is positioned between the ion implantation layer IIL and the color filter layer CF to cover the color filter layer CF and contains an organic material such as acryl, parylene, and epoxy resin.

The ion implantation layer IIL is coated on the surface of the organic overcoat layer 0° C., and is formed when boron B is doped in the organic material such as acryl, parylene, and epoxy resin by an ion implantation method. The ion implantation layer IIL is more hardened than the organic overcoat layer main body OC.

The ion implantation layer IIL which is hardened when boron is doped is coated on the surface of the organic overcoat layer 0° C., and as a result, moisture is suppressed from being permeated into the organic light emitting diode OLED from the outside through the color filter layer CF and the organic overcoat layer 0° C., and simultaneously, outgasing generated from the color filter layer CF and the organic overcoat layer main body OC of the organic overcoat layer 0° C. is suppressed.

Again, as illustrated in FIG. 3, the second inorganic insulation layer CIL2 is positioned between the organic overcoat layer 0° C. and the organic light emitting diode OLED and contains an inorganic material such as silicon nitride (SiNx) or silicon oxide (SiOx). The second inorganic insulation layer CIL2 may be formed in a single layer or a multilayer. The second inorganic insulation layer CIL2 containing the inorganic material is positioned between the organic overcoat layer 0° C. and the organic light emitting diode OLED, and as a result, moisture is suppressed from being permeated into the organic light emitting diode OLED from the outside through the color filter layer CF and the organic overcoat layer 0° C., and simultaneously, outgasing generated from the color filter layer CF and the organic overcoat layer 0° C. is suppressed.

The organic light emitting diode OLED is positioned on the second inorganic insulation layer CIL2 positioned on the organic overcoat layer 0° C. and emits white light. The organic light emitting diode OLED includes a first electrode E1, an organic emission layer OL, and a second electrode E2.

The first electrode E1 is a light transmitting electrode, and the second electrode E2 is a light reflective electrode. As a result, the light emitted from the organic emission layer OL of the organic light emitting diode OLED is reflected by the second electrode E2 and irradiated in the first electrode E1 direction to be outputted from the outside of the substrate SUB through the color filter layer CF. That is, the display device 1000 according to the first embodiment is a bottom emission type.

Three or more emission layers emitting red, blue, and green light, respectively are laminated or an emission layer emitting white light is included, and as a result, the organic emission layer OL emits white light.

Meanwhile, the display device 1000 constructed with the first embodiment substantially describes the organic light emitting diode display as an example, but a display device according to another embodiment may be other display devices such as a liquid crystal display including the color filter layer.

Meanwhile, the display device 1000 constructed with the first embodiment includes the first inorganic insulation layer CIL1 and the second inorganic insulation layer CIL2, but in a display device constructed with another, the first inorganic insulation layer CIL1 and the second inorganic insulation layer CIL2 may be omitted.

As described above, the display device 1000 constructed with the first embodiment includes the ion implantation layer IIL which is coated on the surface of the organic overcoat layer 0° C. covering the color filter layer CF in the hardened state, and as a result, moisture is suppressed from being permeated into the organic light emitting diode OLED from the outside through the color filter layer CF and the organic overcoat layer 0° C., and simultaneously, outgasing generated from the color filter layer CF and the organic overcoat layer main body OC of the organic overcoat layer 0° C. is suppressed.

Further, in the display device 1000 constructed with the first embodiment, the first inorganic insulation layer CIL1 containing the inorganic material is positioned between the substrate SUB and the color filter layer CF, and as a result, moisture is suppressed from being permeated into the organic light emitting diode OLED from the outside, and simultaneously, outgasing generated from the color filter layer CF and the organic overcoat layer 0° C. is suppressed.

Further, in the display device 1000 constructed with the first embodiment, the second inorganic insulation layer CIL2 containing the inorganic material is positioned between the organic overcoat layer 0° C. and the organic light emitting diode OLED, and as a result, moisture is suppressed from being permeated into the organic light emitting diode OLED from the outside through the color filter layer CF and the organic overcoat layer 0° C., and simultaneously, outgasing generated from the color filter layer CF and the organic overcoat layer 0° C. is suppressed.

As described above, although the display device 1000 constructed with the first embodiment includes the color filter layer CF and the organic overcoat layer 0° C. made of the organic material, primarily, the ion implantation layer IIL suppresses the external moisture from being permeated into the organic light emitting diode OLED through the color filter layer CF and the organic overcoat layer 0° C. and the outgasing generated from the color filter layer CF and the organic overcoat layer 0° C. is suppressed at the same time; secondarily, the first inorganic insulation layer CIL1 and the second inorganic insulation layer CIL2 suppress the external moisture from being permeated into the organic light emitting diode OLED through the color filter layer CF and the organic overcoat layer 0° C. and the outgasing generated from the color filter layer CF and the organic overcoat layer 0° C. is suppressed at the same time, respectively. As a result, it is possible to minimize the external moisture from permeating the organic light emitting diode OLED through the color filter layer CF and the organic overcoat layer 0° C. and simultaneously, the outgasing generated from the color filter layer CF and the organic overcoat layer 0° C. is minimized.

That is, although the display device 1000 constructed with the first embodiment includes the color filter layer CF and the organic overcoat layer 0° C. made of the organic material, the display device 1000 capable of minimizing the outgasing phenomenon generated from the color filter layer CF and the organic overcoat layer 0° C. and minimizing the external moisture from permeating the organic light emitting diode OLED through the color filter layer CF and the organic overcoat layer 0° C. at the same time is provided. As a result, the display device 1000 with improved reliability of the organic light emitting diode OLED is provided.

Hereinafter, a method for manufacturing a display device according to a second embodiment will be described with reference to FIGS. 5 to 8.

A method for manufacturing a display device according to a second embodiment may be a method for manufacturing the display device 1000 according to the first embodiment described previously.

Figure 5:
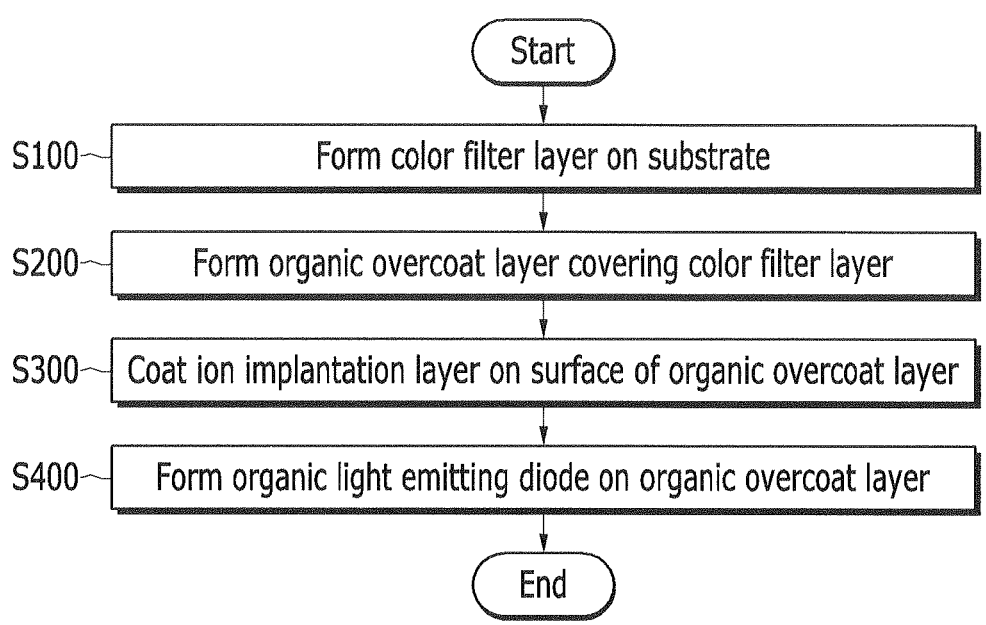
FIG. 5 is a flowchart illustrating a method for manufacturing a display device according to a second embodiment of the present invention.
Figure 6:
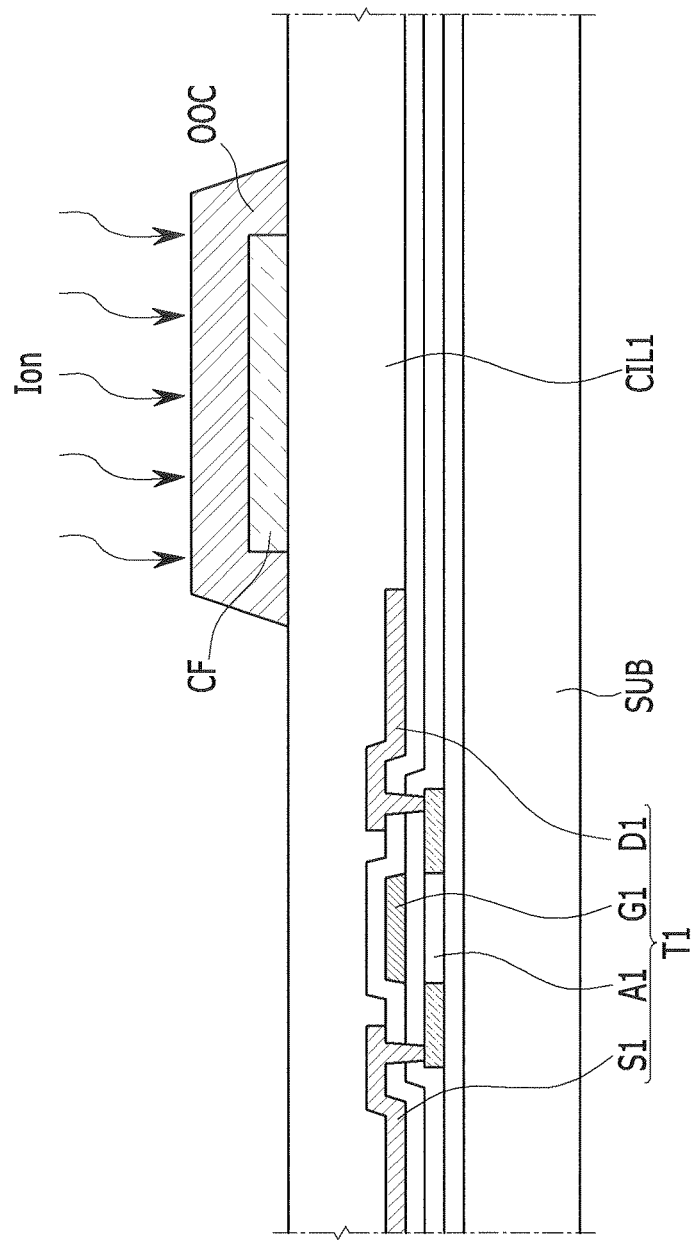
FIGS. 6 through 8 are diagrams for describing the method for manufacturing a display device according to the second embodiment of the present invention.
Figure 7:
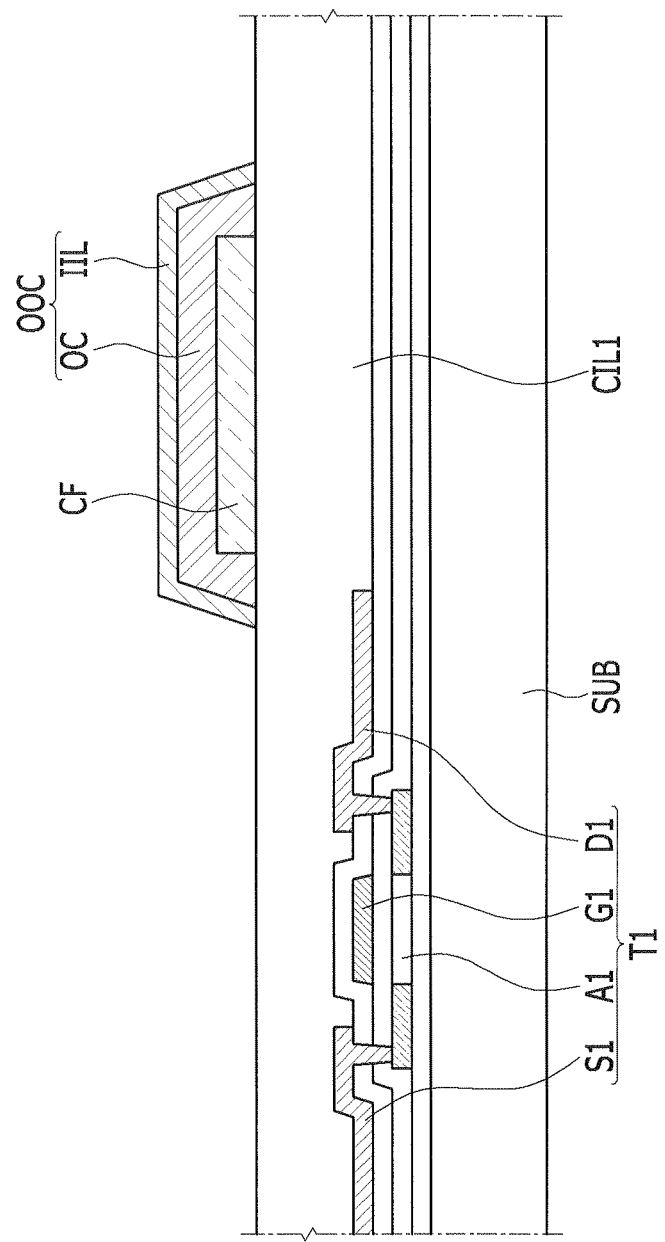
Figure 8:
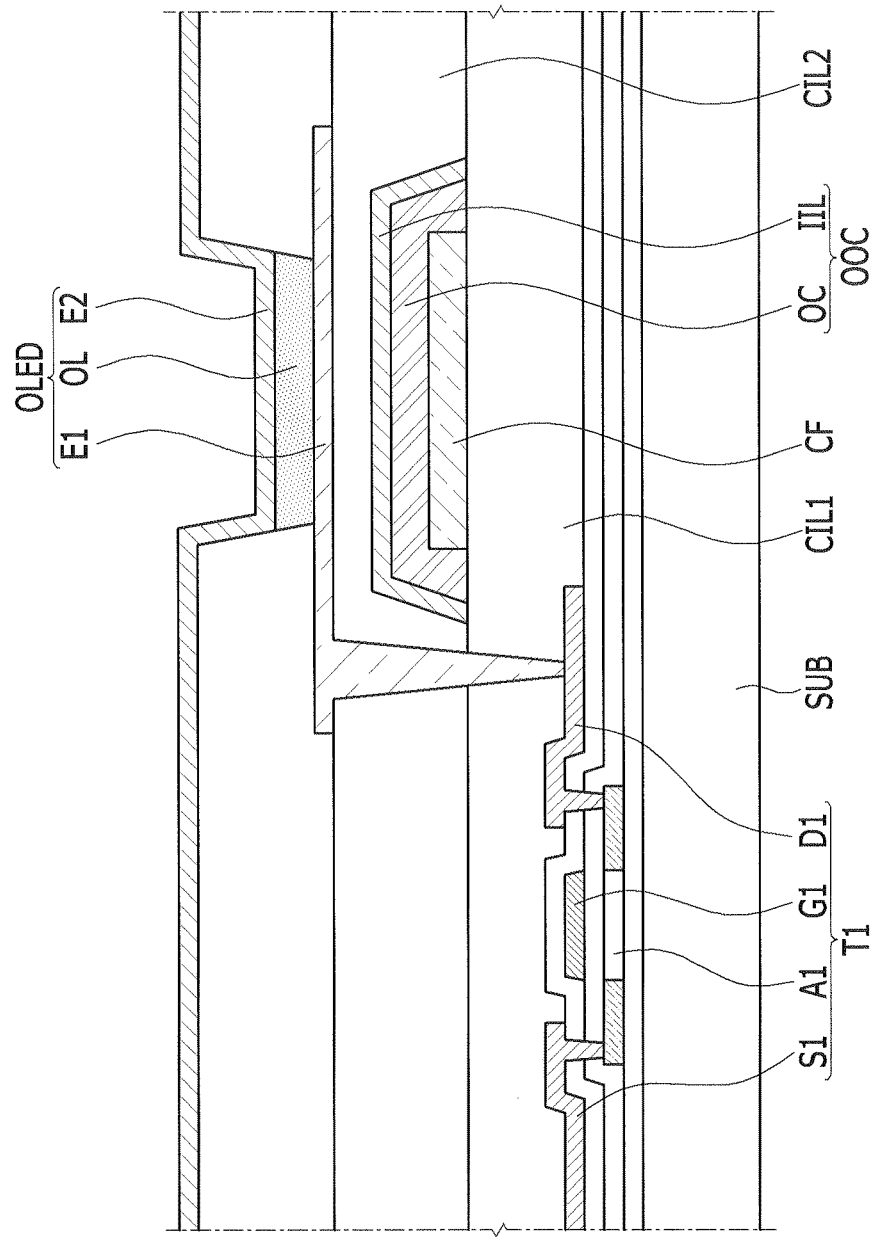

FIG. 5 is a flowchart illustrating a method for manufacturing a display device according to a second embodiment. FIGS. 6 through 8 are diagrams for describing the method for manufacturing a display device according to the second embodiment.

First, as illustrated in FIGS. 5 and 6, the color filter layer CF is formed on the substrate SUB (S100).

In detail, the driving thin film transistor T1 is formed on the substrate SUB by using a MEMS process such as a photolithography process, the first inorganic insulation layer CIL1 is formed on the driving thin film transistor T1, and thereafter, the color filter layer CF is formed on the first inorganic insulation layer CIL1 which is formed on the substrate SUB corresponding to a path along which image is outputted, in which the organic light emitting diode OLED is formed. The color filter layer CF may be formed by using exposing and developing processes using a mask, after an organic material containing a photoresist material is entirely coated on the first inorganic insulation layer CIL1.

Meanwhile, when the driving thin film transistor T1 is formed, the switching thin film transistor and the capacitor may be formed at the same time.

Next, the organic overcoat layer 0° C. covering the color filter layer CF is formed (S200).

In detail, the organic overcoat layer 0° C. covering the color filter layer CF is formed on the substrate SUB with protrusions and depressions formed by the color filter layer CF. The organic overcoat layer 0° C. may be formed by coating the organic material such as acryl, parylene, and epoxy resin on the entire surface of the substrate SUB or only a portion where the color filter layer CF is positioned.

Next, as illustrated in FIGS. 6 and 7, the ion implantation layer IIL is coated on the surface of the organic overcoat layer 0° C. (S300).

In detail, the ion implantation layer IIL is coated on the surface of the organic overcoat layer 0° C. by doping boron B onto the organic overcoat layer 0° C. made of the organic material such as acryl, parylene, and epoxy resin by using an ion implanting method. The boron is doped onto the surface of the organic overcoat layer 0° C., and as a result, the surface of the organic overcoat layer 0° C. is hardened and the ion implantation layer IIL which is more hardened than the organic overcoat layer main body OC is formed. In the ion implanting method used when the ion implantation layer IIL is formed, an acceleration voltage may be 60 KeV or more and gas may use $BF_3$.

Next, as illustrated in FIG. 8, the organic light emitting diode OLED is formed on the organic overcoat layer 0° C. (S400).

In detail, the organic light emitting diode OLED is formed by forming the first electrode E1, the organic emission layer OL, and the second electrode E2 on the organic overcoat layer 0° C. in sequence.

Thereafter, an encapsulation unit encapsulating the organic light emitting diode OLED may be further formed.

As described above, in the method for manufacturing the display device according to the second embodiment, the ion implantation layer IIL coated on the surface of the organic overcoat layer 0° C. covering the color filter layer CF in the hardened state is formed and thereafter, the organic light emitting diode OLED is formed, and as a result, since the outgasing generated from the color filter layer CF and the organic overcoat layer main body OC of the organic overcoat layer 0° C. is blocked by the ion implantation layer IIL during the manufacturing process, a defect of the organic light emitting diode OLED due to the outgasing generated from the color filter layer CF and the organic overcoat layer 0° C. is minimized.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device for displaying an image, comprising:
   a substrate;
   a color filter layer positioned on the substrate geometrically corresponding to a path along which the image is outputted; and
   an organic overcoat layer covering the color filter layer, the organic overcoat layer comprising an ion implantation layer coated on a surface of the organic overcoat layer.

2. The display device of claim 1, wherein:
   the organic overcoat layer further includes an organic overcoat layer main body which is positioned between the ion implantation layer and the color filter layer, and
   the ion implantation layer is more hardened than the organic overcoat layer main body.

3. The display device of claim 1, wherein:
   the organic overcoat layer contains an organic material, and
   the ion implantation layer is formed by doping boron B in the organic material by an ion implanting method.

4. The display device of claim 1, further comprising:
   an organic light emitting diode positioned on the organic overcoat layer and emitting white light.

5. The display device of claim 4, wherein:
   the organic light emitting diode includes
   a first electrode positioned on the organic overcoat layer;
   an organic emission layer positioned on the first electrode and emitting white light; and
   a second electrode positioned on the organic emission layer.

6. The display device of claim 5, wherein:
   the first electrode has a light transmitting property, and the second electrode has a light reflective property.

7. The display device of claim 5, further comprising:
   a thin film transistor connected with the first electrode.

8. The display device of claim 4, further comprising:
   a first inorganic insulation layer positioned between the substrate and the color filter layer.

9. The display device of claim 4, wherein:
   a second inorganic insulation layer positioned between the organic overcoat layer and the organic light emitting diode.

10. A method for manufacturing a display device displaying an image, comprising steps of:
    forming a color filter layer on a substrate geometrically corresponding to a path along which the image is outputted;
    forming an organic overcoat layer covering the color filter layer; and
    coating an ion implantation layer on the surface of the organic overcoat layer.

11. The method for manufacturing a display device of claim 10, wherein:
    the organic overcoat layer contains an organic material, and the coating of the ion implantation layer on the surface of the organic overcoat layer is performed by doping boron B in the organic material of the organic overcoat layer by using an ion implanting method.

12. The method for manufacturing a display device of claim 10, further comprising:
forming an organic light emitting diode emitting white light on the organic overcoat layer.

13. A display device manufactured by the method of claim 12, wherein:
a second inorganic insulation layer positioned between the organic overcoat layer and the organic light emitting diode.

14. The display device of claim 13, wherein:
the organic overcoat layer further includes an organic overcoat layer main body which is positioned between the ion implantation layer and the color filter layer, and
the ion implantation layer is more hardened than the organic overcoat layer main body.

15. The display device of claim 13, wherein:
the organic overcoat layer contains an organic material, and the ion implantation layer is formed by doping boron B in the organic material by an ion implanting method.

16. The display device of claim 13, further comprising:
an organic light emitting diode positioned on the organic overcoat layer and emitting white light.

17. The display device of claim 16, wherein the organic light emitting diode includes:
a first electrode positioned on the organic overcoat layer;
an organic emission layer positioned on the first electrode and emitting white light; and
a second electrode positioned on the organic emission layer.

18. The display device of claim 17, wherein the first electrode has a light transmitting property, and the second electrode has a light reflective property.

19. The display device of claim 17, further comprising a thin film transistor connected with the first electrode.

20. The display device of claim 15, further comprising:
a first inorganic insulation layer positioned between the substrate and the color filter layer.

* * * * *